United States Patent [19]

Sakakibara et al.

[11] Patent Number: 5,049,919
[45] Date of Patent: Sep. 17, 1991

[54] IMAGE RECORDING APPARATUS HAVING REVERSAL SHEET FEEDING DEVICE AND CONTROL MEANS FOR STARTING IMAGE RECORDING OPERATION IN CONNECTION WITH THE REVERSAL SHEET FEED

[75] Inventors: Kenji Sakakibara, Ichinomiya; Yumio Matsumoto, Kasugai; Takashi Nakata, Nagoya, all of Japan

[73] Assignee: Brother Kogyo Kabushiki Kaisha, Aichi, Japan

[21] Appl. No.: 599,981

[22] Filed: Oct. 19, 1990

[30] Foreign Application Priority Data

Oct. 24, 1989 [JP] Japan .................................. 1-276374
Oct. 26, 1989 [JP] Japan .................................. 1-279212

[51] Int. Cl.⁵ ...................... G03B 27/32; G03B 27/52
[52] U.S. Cl. ........................................ 355/27; 355/72
[58] Field of Search ............................ 355/50, 27, 72; 430/138; 226/108, 118, 49-51

[56] References Cited

U.S. PATENT DOCUMENTS

| | | | |
|---|---|---|---|
| 4,777,513 | 10/1988 | Nelson | 355/27 |
| 4,801,976 | 1/1989 | Hayashi | 355/28 |
| 4,819,024 | 4/1989 | Kagayama et al. | 355/284 |
| 4,935,768 | 6/1990 | Ibuchi | 355/27 |
| 4,935,769 | 6/1990 | Ogura | 355/27 |
| 4,945,381 | 7/1990 | Yamagata et al. | 355/27 |
| 4,945,382 | 7/1990 | Yui et al. | 355/27 |

Primary Examiner—Richard A. Wintercorn
Attorney, Agent, or Firm—Oliff & Berridge

[57] ABSTRACT

An image recording apparatus using an elongated photosensitive recording medium stored in a sheet cartridge in a rolled fashion. The apparatus provides an exposure stand and a reversal sheet feeding arrangement for reversely feeding completely unexposed microcapsule sheet to a position upstream of the exposure stand for the purpose of a subsequent exposure operation. A control means is further provided for automatically starting the subsequent copying operation. In one embodiment, the control means stores therein a copy start signal and automatically starts the next copying operation upon completion of the reversal sheet feeding operation. The copy start signal is generated by the manipulation of the copy start key manipulated at the reversal sheet feeding phase. In another embodiment of this invention, the control means forcibly stops the reversal sheet feeding operation in response to the copy start signal so as to automatically start the copying operation. The copy start signal is generated by the manipulation of the copy start key manipulated at the reversal sheet feeding phase.

8 Claims, 5 Drawing Sheets

5,049,919

IMAGE RECORDING APPARATUS HAVING REVERSAL SHEET FEEDING DEVICE AND CONTROL MEANS FOR STARTING IMAGE RECORDING OPERATION IN CONNECTION WITH THE REVERSAL SHEET FEED

BACKGROUND OF THE INVENTION

The present invention relates to an image recording apparatus which uses an elongated photosensitive recording medium, and more particularly, to such apparatus provided with a reversal sheet feeding device and control means for starting an image recording operation in connection with the reversal feeding of the recording medium.

Known is a photosensitive image recording medium including a photosensitive pressure sensitive recording medium and a developer medium. The photosensitive pressure sensitive recording medium comprises a microcapsule sheet whose microcapsules encapsulate therein chromogenic material or dye precursor, and the developer medium includes a substrate and developer material layer coated thereover. Such image recording medium is disclosed for example in U.S. Pat. No. 4,399,209.

In one conventional image recording apparatus, transfer type image recording operation has been achieved. That is, the microcapsule sheet is subjected to an image light exposure for selectively changing physical property of the microcapsules dependent on the light exposure, to thereby form a latent image. Then, the light exposed microcapsule sheet is superposed with the developer medium and the two sheets are pressed together, so that the chromogenic material are selectively reacted with the developer material to provide an output image on the developer sheet.

To achieve the above operation, the elongated microcapsule sheet passes through its sheet path extending through, in order, an exposure stand, a pressure developing unit, and a thermal fixing unit. In one image recording or copying operation, a given length of the microcapsule sheet is required. In this case, as shown in FIG. 1(a) the light exposed zone E of the microcapsule sheet M is delivered to the pressure developing unit and at the same time, the subsequent green zone G of the microcapsule sheet (entirely unexposed zone) is also passed through the exposure stand. If the next exposure operation for the next image recording operation is started with a subsequent zone S, the green zone G is disadvantageously wasted. As a result, copying cost increased if great numbers of copying operation is repeatedly carried out.

To avoid this problem, after the pressure developing operation with respect to the precedent exposure zone E, the microcapsule sheet M is reversely fed toward a microcapsule sheet supply side such as toward a sheet cartridge so as to start the next copying operation with a minimized length of the green zone G' as shown in FIG. (b). Such reversal sheet feeding is provided by reversely rotating the sheet cartridge for rewinding the microcapusle sheet therein.

In the conventional image recording apparatus having the reversal sheet feeding system, even if urgent copying operation is required at the time of the reversal sheet feeding period, for example even if an operator depresses a copy start key during the reversal sheet feeding period, the intended copying cannot be started until the reversal sheet feeding operation is completed. Therefore, the operator must again manipulate or depress the copy start key after the completion of the reversal sheet feed. Such manipulation would be troublesome and time consuming.

Incidentally, reversal sheet feeding means is disclosed in U.S. Pat. Nos. 4,819,024 and 4,801,976.

SUMMARY OF THE INVENTION

It is therefore, an object of the present invention to overcome the above described drawbacks and to provide an improved image recording apparatus having a reversal sheet feed system in which next copying operation is automatically started in response to the depression of the copy start key.

Another object of the invention is to provide such apparatus in which the next copying operation can be automatically started upon completion of a reversal sheet feeding operation in response to the depression of the copy start key at the phase of the reversal sheet feed without additional depression of the copy start key after the completion of the reversal sheet feed.

Still another object of the invention is to provide such apparatus in which the next copying operating can be automatically and promptly started with forcibly terminating the reversal sheet feeding operation in response to the depression of the copy start key at the phase of the sheet reversal feed.

These and other objects of the present invention will be attained by providing an image recording apparatus using an elongated photosensitive recording medium, the elongated photosensitive recording medium being formed with a precedent latent image section and subsequent non imaging section with respect to a longitudinal direction thereof, the apparatus comprising a copy start key which generates a copy start signal for starting a copying operation, a medium cartridge for storing therein a rolled elongated photosensitive recording medium, a takeup means for taking up the imaging section of the photosensitive recording medium, the photosensitive recording medium being fed from the medium cartridge to the takeup means, an exposure means positioned between the medium cartridge and the takeup means for exposing the photosensitive recording medium to light for providing the latent image section, reversal sheet feeding means for reversely feeding the photosensitive recording medium so as to position the subsequent non imaging section to upstream of the exposure means, and control means for automatically starting a next copying operation in response to manipulation of the copy start key at the reversal sheet feed phase. The control means includes memory means for storing therein the copy start signal and for automatically starting the next copying operation upon completion of the reversal sheet feeding operation, the copy start signal being generated by the manipulation of the copy start key manipulated at the reversal sheet feeding phase.

In another aspect of the invention there is provided an image recording apparatus using an elongated photosensitive recording medium, the elongated photosensitive recording medium being formed with a precedent latent image section and subsequent non imaging section with respect to a longitudinal direction thereof, the apparatus comprising a copy start key which generates a copy start signal for starting a copying operation, a medium cartridge for storing therein a rolled elongated photosensitive recording medium, a takeup means for taking up the image section of the photosensitive recording medium, the photosensitive recording medium being fed from the medium cartridge to the takeup means, an exposure means positioned between the medium cartridge and the takeup means for exposing the photosensitive recording medium to light for providing the latent image section, reversal sheet feeding means for reversely feeding the photosensitive recording medium so as to position the subsequent non imaging section to upstream of the exposure means, and control means for automatically starting a next copying operation in response to manipulation of the copy start key at the reversal sheet feed phase, the control means comprising a control unit for forcibly stopping the reversal sheet feeding operation in response to the copy start signal so as to automatically start for copying operation, the copy start signal being generated by the manipulation of the copy start key manipulated at the reversed sheet feeding phase.

BRIEF DESCRIPTION OF THE INVENTION

In the drawings:

FIGS. 1(a) and 1(b) are views for description of a wasted area of a microcapsule sheet, which wasted area is defined between a preceding light-exposed zone and subsequent unexposed zone thereof;

Figure 6:
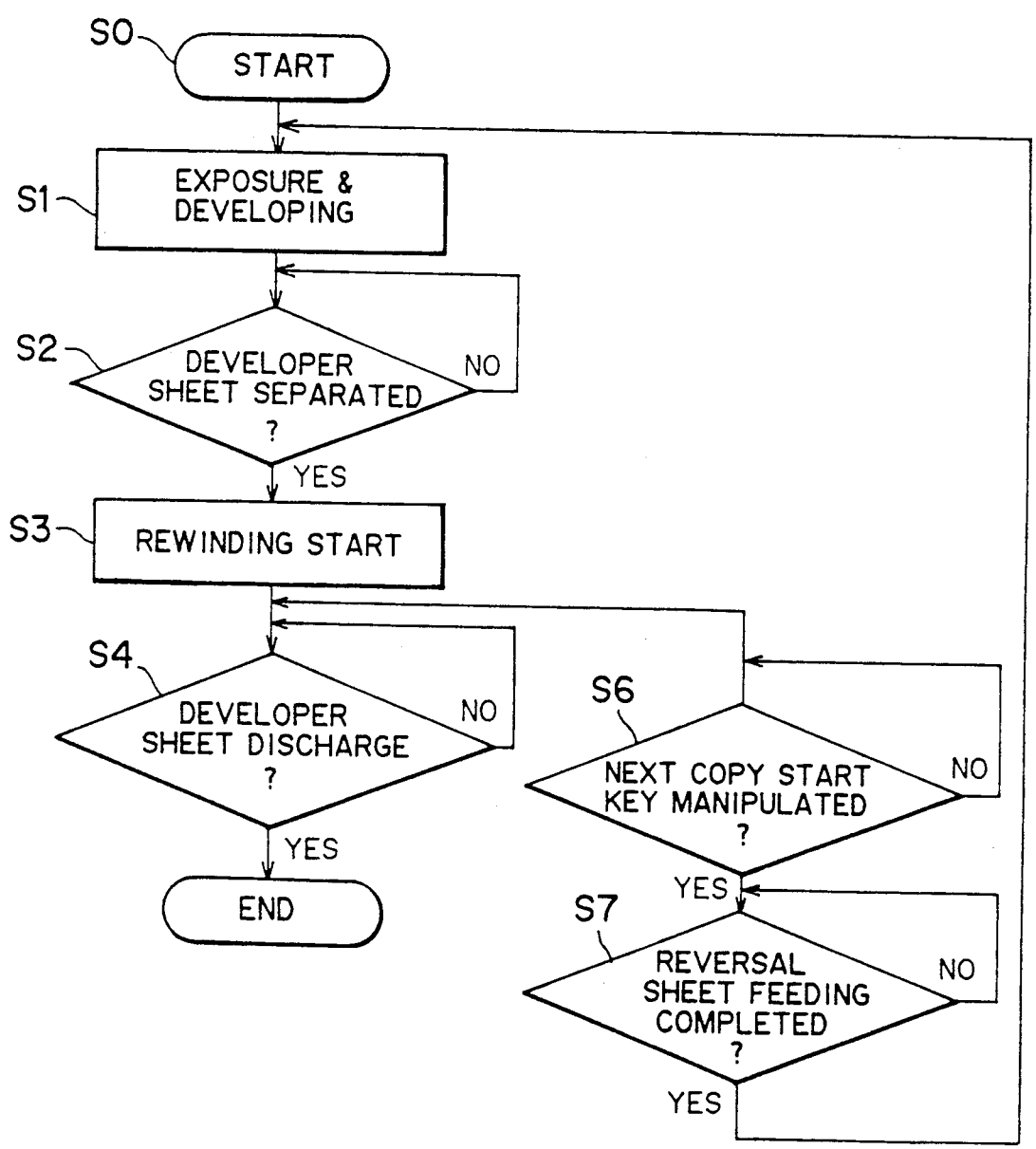
Figure 7:
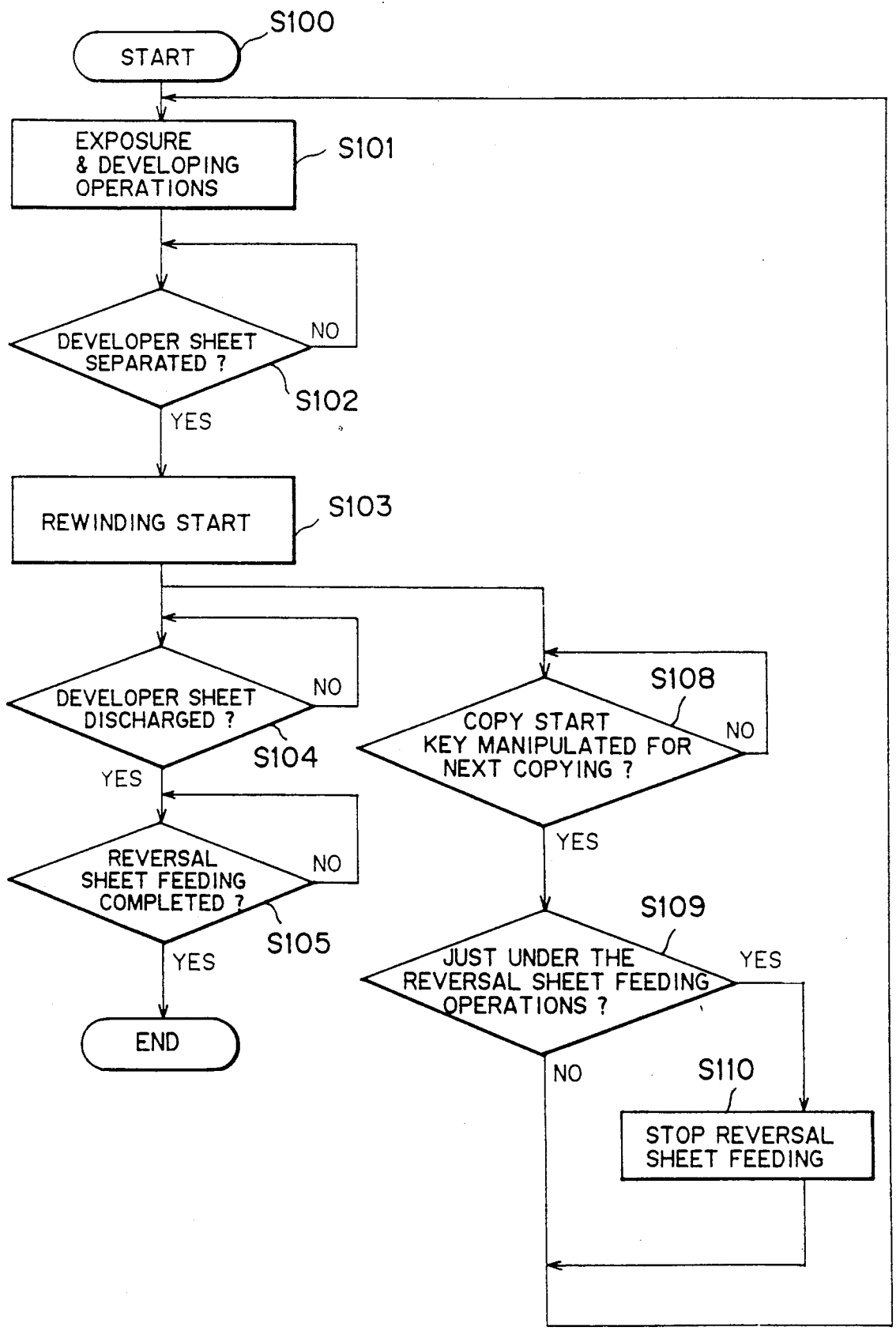

FIG. 6 is a flowchart for description of operational sequence in the copying machine and the copy start operation in connection with the reversal sheet feeding operation according to the first embodiment of this invention; and FIG. 7 is a flowchart for description of operational sequence in the copying machine and the copy start operation in connection with the reversal sheet feeding operation according to a second embodiment of this invention.

DETAILED DESCRIPTION OF THE PREFERRED EMBODIMENTS

Figure 2:
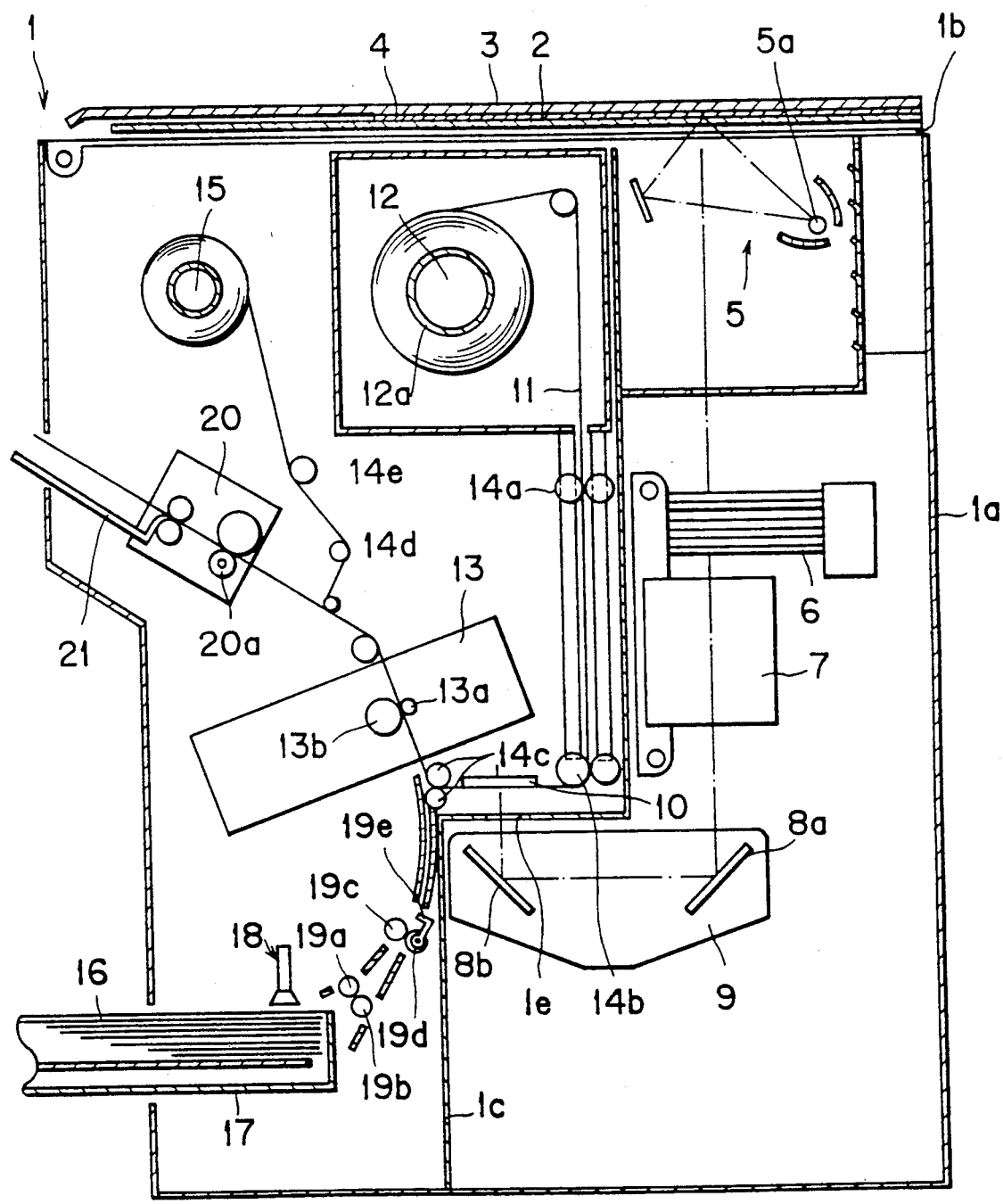
FIG. 2 is a schematic cross-sectional view showing an image recording apparatus to which the present invention is applicable.

An image recording apparatus is shown in FIG. 2 to which the present invention is applicable. The recording apparatus 1 pertains to a full color copying machine and employs a photosensitive sheet medium including a microcapsule sheet 11 and a developer sheet 16 those described in U.S. Pat. No. 4,399,209.

At an upper portion of the apparatus 1, a transparent original support glass 2 for mounting an original 4 thereon and a cover 3 for selectively covering the support glass 2 are laterally movably provided. On the original support glass 2, the original 4 is mounted with its imaging surface facing downwardly. At a position below the original support glass 2, there is provided a light source 5 including a halogen lamp 5a for irradiating a line-light to the original 4 through the original support glass 2 by way of a slit formed in a top plate 1b pivotably connected to a frame body 1a. The line-light passes through the original support glass 2 and is reflected at a surface of the original 4. The halogen lamp 5a extends in a direction perpendicular to the moving direction of the original support glass 2. During light emission from the light source 5, the original support glass 2 is laterally moved so that the overall area of the original 4 is subjected to light irradiation line by line basis.

At a central portion of the copying machine 1, an exposure stand 10 is disposed. Further, between the light source 5 and the exposure stand 10, there is provided an optical system including a color tone controlling filter unit 6, a light condensing lens unit 7 and a pair of reflection mirrors 8a and 8b. The pair of reflection mirrors 8a, 8b are secured to an attachment plate 9 which is movable for controlling optical path length and focal length relative to a photosensitive recording medium such as the microcapsule sheet 11 on the exposure stand 10. Therefore, light from the light source 5 passing through the slit is reflected at the original 4, and the reflected light passes through the filter unit 6, the lens unit 7 and the reflection mirrors 8a, 8b, to thereby reach the exposure stand 10. In other words, generally J-shape light path is provided between the light source 5 and the exposure stand 10 so that the light direction can be substantially inverted. Consequently, at the exposure stand 10, a latent image is formed on the microcapsule sheet 11 corresponding to an image of the original 4. More specifically, light exposed microcapsules are photo-cured, whereas unexposed microcapsules are not hardened. Incidentally, a light shielding cover member 1c is provided for preventing the light from the original from applying on the microcapsule sheet 11 running at a position in the vicinity of the optical unit. In other words, the light can only be passed through a slit 1d of the shielding wall 1c for permitting light exposure to the sheet 11 at the exposure stand 10.

At an upper inner space of the copying machine 1, a microcapsule sheet cartridge 12 is detachably provide, and a tape-up shaft 15 is rotatably provided. In the sheet cartridge 12, stored is the rolled microcapsule sheet 11 carrying microcapsules which encapsulate therein chromogenic material for color copying. A hollow cartridge shaft 12a is provided for winding the microcapsule sheet 11 thereover. A plurality of feed rollers 14a, 14b, 14c are rotatably provided so as to feed the elongated microcapsule sheet 11 from the sheet cartridge 12. The thus pulled-out microcapsule sheet 11 passes through the exposure stand 10 where the sheet 11 is exposed to light in order to form a latent image thereon. The sheet 11 is taken up over the take-up shaft 15.

Below the exposure stand 10, a developer sheet cassette 17 is detachably provided which stores a stack of cut developer sheets 16. Further, a sheet feed mechanism 18 such as a suction foot is provided for feeding each one of the developer sheet 16. For the sheet further delivery, a feed roller 19a and a pinch roller 19b are provided. At a downstream side of these rollers 19a and 19b, a developer sheet rollers 19c, 19d and a resist gate 19e are provided so as to align a leading edge of the developer sheet 16 in order to feed the developer sheet 16 to a pressure developing unit 13 with its correct orientation. Incidentally, instead of the suction foot 18, a drive sector roller (not shown) is also available.

Further, the pressure developing unit 13 having a small diameter roller 13a and a back-up roller 13b is provided between the exposure stand 10 and the tape-up shaft 15. These rollers 13a and 13b are relatively movable toward and away from each other for selecting applying pressure to the microcapsule sheet 11. The light exposed portion of the microcapsule sheet 11 and the developer sheet 16 delivered from the cassette 17 are in close contact with each other and these are pressed together by the rollers 13a, 13b. Consequently, non-exposed microcapsules are ruptured by the pressure for causing chromogenic reaction between a chromogenic material in the microcapsules and the developer materials on the developer sheet 16, and as a result, a colored visible image corresponding to the latent image is formed on the developer sheet 16.

Further, at a downstream side of the pressure developing unit 13, two sheet passages are provided for directing the microcapsule sheet 11 toward the take-up shaft 15 and for directing the developer sheet 16 to a thermal fixing unit 20. For this, a separation roller 14d is provided at a downstream side of the pressure developing unit 13 for separating the microcapsule sheet 11 from the developer sheet 16. A meandering travel control roller 14e is movably provided between the separation roller 14d and the take-up shaft 15. Furthermore, at downstream side of the separation roller 14d, the thermal fixing unit 20 including a heat roller 20a is provided for thermally fixing an output image on the developer sheet 16. At downstream side of the thermal fixing unit 20, a sheet tray 21 is provided for receiving the developer sheet carrying the final output image.

Upon manipulation of a start button (not shown), the original support glass 2 is moved to one direction (rightwardly in FIG. 2), so that a left edge of the original is brought into confrontation with the halogen lamp 5a, and thereafter, the halogen lamp 5a is turned on. The original support glass is then moved to opposite direction (leftwardly in FIG. 2) during which the original 4 is successively subjected to a line-light exposure.

At the same time, the microcapsule sheet 11 is moved toward the take-up shaft 15 at the speed equal to the moving speed of the original support glass 2. Therefore, a latent image corresponding to the original image is successively formed on the microcapsule sheet 11 when it travels over the exposure stand 10. On the other hand, each one of the developer sheet 16 is delivered from the sheet cassette 17 to the pressure developing unit 13 in synchronism with the every leftward movement of the original support glass 2. The latent image portion of the microcapsule sheet 11 and the developer sheet 16 are pressed together at the pressure developing unit 13, so that a colored visible image is formed on the developer sheet 16. Thereafter, the developer sheet 16 is introduced into the thermal fixing unit 20 so as to fix the color image on the sheet 16, and is then discharged onto the discharge tray 21. On the other hand, the microcapsule sheet 11 passes through the separation roller 14d, and the meandering travel controlling roller 14e and is wound over the take-up shaft 15.

Next, one example of the sheet cartridge 12 and the reversal sheet feeding mechanism incorporated into the above described image recording apparatus will be described with reference to FIGS. 3 and 4.

Figure 3:
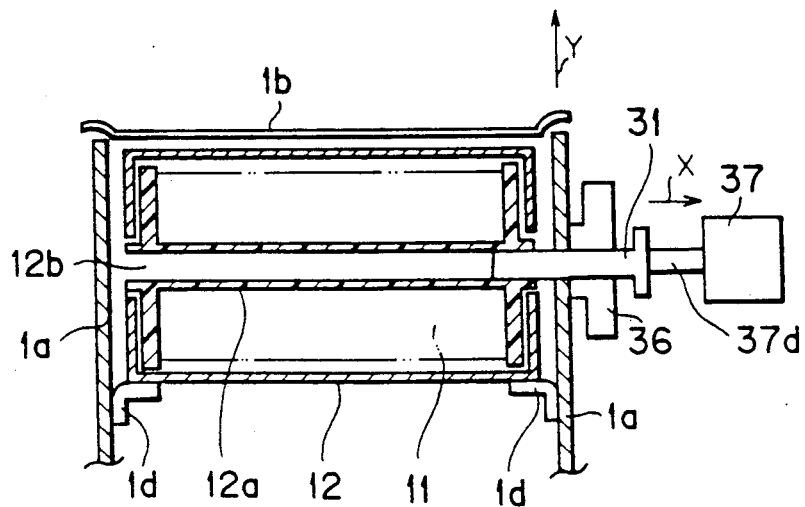
FIG. 3 is a cross-sectional view showing a sheet cartridge and ambient components according to a first embodiment of this invention.

In FIG. 3, the sheet cartridge 12 is detachably mounted on seats 1d secured to the frame 1a. The cartridge shaft 12a defines therein a hollow space 12b, in which a tapered pin 31 is insertable. The tapered pin 31 is formed with a spline (not shown) so that the tapered pin 31 and the hollow cartridge shaft 12a are rotatable together. Further, a rewinding gear 36 formed with a spline hole is disposed over the tapered pin 31. The rewinding gear 36 is drivingly connected to a drive mechanism (FIG. 4). The tapered pin 31 is movable with respect to the rewinding gear 36 in accordance with the axial movement of the pin 31 with respect to the hollow cartridge shaft 12a. Upon energization of the drive source (not shown), the rewinding gear 36 is rotated about its axis, so that the tapered pin 31 and the hollow cartridge shaft 12a are also rotated about their axes. By this rotation, the microcapsule sheet undergoes rewinding over the cartridge shaft 12a.

The top plate 1b is associated with a switch (not shown) which is rendered ON when the top plate 1b is pivotally moved in a direction indicated by an arrow Y in FIG. 3. Further, a solenoid (cartridge releasable solenoid) 37 is provided whose plunger 37d is coupled to a distal end face of the tapered pin 31. The solenoid 37 is energized in response to the ON signal, so that the tapered pin 31 is pulled to disengage from the hollow cartridge shaft 12a. Therefore, the cartridge 12 can be detached from the frame 1a for exchanging with a new cartridge 12.

Figure 4:
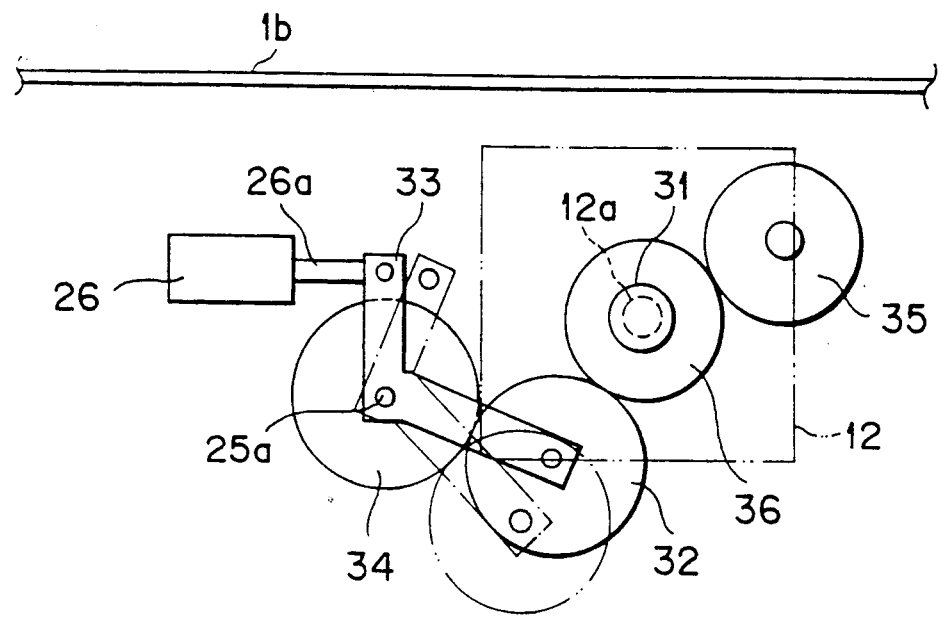
FIG. 4 is a schematic view showing a drive mechanism for selectively rotating a cartridge shaft about its axis according to the first embodiment of this invention.
Figure 5:
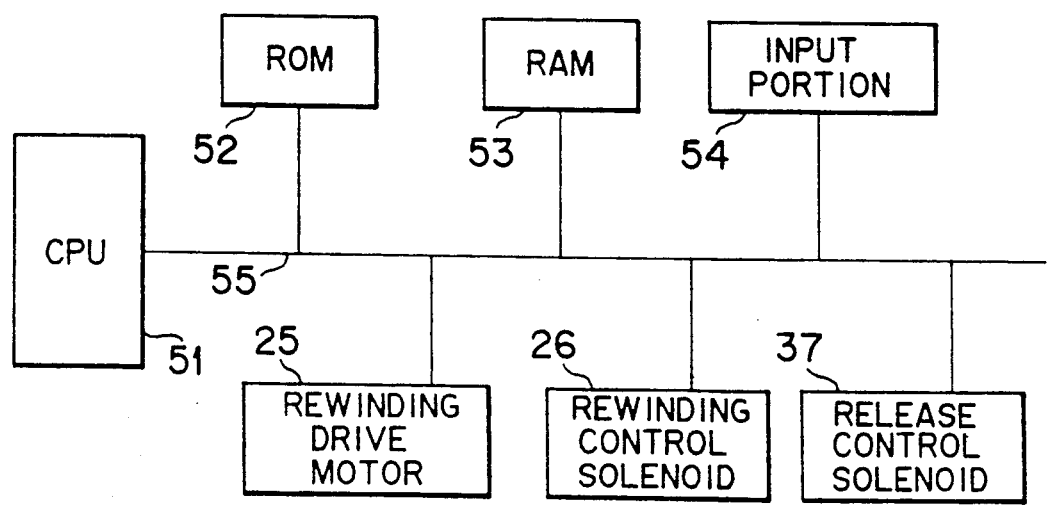
FIG. 5 is a schematic illustration for description of control arrangement for controlling a start of a copying operation in connection with a reversal sheet feeding operation according to the first embodiment of this invention.

FIG. 4 shows the drive mechanism for selectively driving the rewinding gear 36. The drive mechanism includes an idle gear 32 selectively meshedly engageable with the rewinding gear 36. An L-shaped lever 33 has an intermediate portion pivotally connected to a motor shaft 25a of a rewinding drive motor 25 (FIG. 5). The L-shaped lever 33 has one end rotatably supporting the idle gear 32 and has another end pivotally coupled to a plunger 26a of a rewinding control solenoid 26. The rewinding control solenoid 26 is adapted to be turned ON so as to start the rewinding operation of the cartridge shaft 12a. The solenoid 26 is rendered OFF if predetermined amount of the microcapsule sheet 11 is rewound over the cartridge shaft 12a. The motor shaft 25a mounts thereon a drive gear 34 which is continuously meshingly engaged with the idle gear 32. Upon energization of the rewinding drive motor 25 (FIG. 5), the drive gear 34 is rotated about its axis for rotating the idle gear 32 about its axis.

The rewinding control solenoid 26 provides its first position for providing a first pivot position of the L-shaped lever 33 (solid line position in FIG. 4) in order to position the idle gear 32 at its engageable position with the rewinding gear 36. Therefore, the rewinding gear 36 is drivingly connected to the drive gear 34 through the idle gear 32, so that the tapered pin 31 and the hollow cartridge shaft 12a are rotatable about their axis. Accordingly, the microcapsule sheet can be rewound over the cartridge shaft 12a for the reversal feed. The rewinding control solenoid 26 also provides a second position for providing a second pivot position of the L-shaped lever 33 (two dotted chain line position in FIG. 4) in order to position the idle gear 32 to be disengageable from the rewinding gear 36. Therefore driving force of the drive gear 34 is not transmitted to the rewinding gear 36, thereby allowing sheet to be pulled out of the cartridge 12 in case of the ordinary copying operation. Incidentally, in FIG. 4, a friction unit 35 is provided engageable with the rewinding gear 36 so as to impart resistive force to the latter in order to avoid excessive rotation of the cartridge shaft 12a, to thereby avoid sheet slack at the time of the ordinary sheet pulling phase.

Next, control arrangement for starting image recording operation will be described. In the first embodiment, the control arrangement is adapted for automatically starting the next image recording operation by the manipulation of a copy start key manipulated during the phase of the reversal sheet feeding, and the copying is automatically started after reversal sheet feeding is completed. The advantage is that it is unnecessary to again manipulate the copy start key after completion of the reversal sheet feeding.

As shown in FIG. 5, the control arrangement includes a CPU (central processing unit) 51 connecting a system bus 55. To the system bus 55, connected are a ROM 52 in which stored is a program for controlling microcapsule sheet rewinding operation, a RAM 53 for temporarily storing processing data, and an input portion 54 in which various kinds of input keys such as the copy start key are provided. Further, the above described rewinding drive motor 25 for driving the rewinding gear 36, the rewinding control solenoid 26 (FIG. 4) for controlling transmission of the drive force of the drive motor 25 to the rewinding gear 36, and the solenoid 37 (FIG. 3) for controlling disassembly of the sheet cartridge 12 from the frame 1a are also connected to the system bus 55. Therefore, the operations of the rewinding drive motor 25, the rewinding control solenoid 26 and the cartridge releasable solenoid 37 are controlled by the CPU in accordance with the data from the input portion 54, the ROM 52 and the RAM 53.

Next, copying operation and a copy start operation in connection with the reversal sheet feeding will be described with reference to a flowchart shown in FIG. 6.

Figures 1A, 1B:
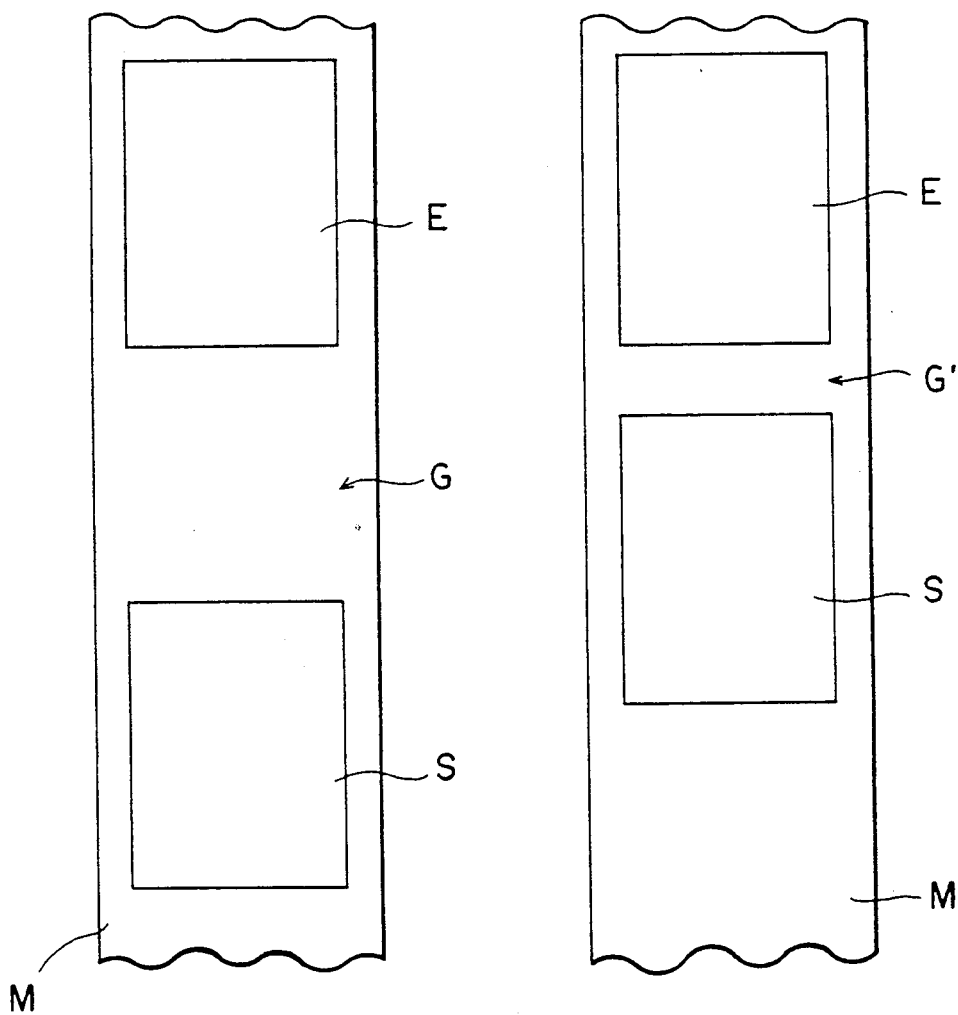

In FIG. 6, when the copy start key is rendered ON for starting the copying operation in Step S1, the exposure and pressure developing operations are started, and in Step S2, determination is made as to whether or not the microcapsule sheet 11 is separated from the developer sheet 16. If YES, reversal feeding operation to the microcapsule sheet 11 is started in Step S3. That is, the rewinding control solenoid 26 is actuated to provide the first position of the first position of the idle gear 32, so that the latter is brought into meshing engagement with the rewinding gear 36. Accordingly, the rotation force of the drive gear 34 is transmitted to the rewinding gear 36 through the idle gear 32 for rotating the cartridge shaft 12a. As a result, the microcapsule sheet 11 is reversely moved for moving the green zone G' (FIG. 1(b)) of the sheet 11 to a position upstream of the exposure stand 10. In Step S4, if the sheet rewinding is completed, the developer sheet 16 is discharged onto the tray 21.

During the reversal sheet feeding operation, if the copy start key is manipulated in Step S6, determination is made as to whether or not the rewinding operation is completed in Step S7. If rendered YES, the copying is immediately started. If rendered NO, copy start standby state is provided so as to automatically start copying operation upon completion of the reversal sheet feeding.

Incidentally, if the sheet cartridge 12 is to be replaced with a new cartridge, as shown in FIG. 3, the solenoid 37 for selectively releasing the sheet cartridge 12 is actuated to move the plunger 37a in one direction (X direction in FIG. 3) in response to the opening pivotal motion of the top plate 1b. Accordingly, the pin 31 is disengaged from the hollow cartridge shaft 12a so as to allow the cartridge 12 to be disassembled from the frame 1a.

As described above, according to the first embodiment of the present invention, the copy start signal can be stored even if the copy start key is manipulated during the reversal sheet feeding phase, and copying operation can be automatically started upon completion of the reversal sheet feeding or sheet winding over the cartridge shaft. Consequently, an operator can leave from the copying machine once depressing the copy start key at the phase of the reversal sheet feeding, and it is unnecessary for the operator to wait completion of the reversal sheet feeding in order to manipulate the copy start key after completion of the reversal sheet feeding.

Next, a control arrangement for automatically starting the copying operation according to a second embodiment will be described. In this control arrangement, if the copy start key is manipulated during the reversal sheet feeding phase, the reversal sheet feed operation is promptly stopped for starting the copying operation. Incidentally, in the first embodiment, the tapered pin 31 is axially movable by the cartridge releasable solenoid 37. However, in the second embodiment, it is possible to mechanically interconnect the tapered pin 31 to the top plate 1b so as to move or retract the tapered pin away from the cartridge shaft 12a in accordance with the opening pivotal motion of the top plate 1b. In this case, the solenoid 37 can be dispensed with. However, biasing means such as a coil spring (not shown) may be required to urge the rewinding gear 36 to have its stationary position regardless of the axial movement of the tapered pin 31. Further, a control arrangement in the second embodiment would be substantially similar to that of the first embodiment shown in FIG. 5 except that the content of ROM 52 is different to a ROM of the second embodiment, and the solenoid 37 of the second embodiment is not provided.

FIG. 7 shows a control routine in the second embodiment. In the routine, Steps S101 through S104 are the same as those of the steps S1 through S4 of the first embodiment. Further, in the second embodiment, determination is made as to whether the reversal sheet feeding operation is completed in Step S105. If rendered YES, the sequential copying operation is completed. (it goes without saying that a step relevant to S105 is also achievable in the first embodiment.)

A CPU 51 determines that whether or nor the next copy start key is manipulated in Step S108. If YES, determination is made in Step S109 as to whether or not the reversal sheet feeding operation is not carried out. If NO, the routine returns to Step S100 for starting the next copying operation. If rendered NO, the reversal sheet feeding operation or rewinding operation is stopped in Step S110, and the routine proceeds into the Step S100 for forcibly starting the next copying operation. Therefore, urgent copying is achievable without waiting for completion of the reversal sheet feed operation and without additional manipulation of the copy start key.

As described above, in the present invention, next copying operation can be automatically started by a single manipulation of the copy start key even at the reversal sheet feed phase, and it is unnecessary for the operator to wait the completion of the reversal sheet feeding.

While the invention has been described in detail and with reference to specific embodiments thereof, it would be apparent to those skilled in the art that various changes and modifications may be made therein without departing from the spirit and scope of the invention.

What is claimed is:

1. An image recording apparatus using an elongated photosensitive recording medium, the elongated photosensitive recording medium being formed with a precedent latent image section and subsequent non imaging section with respect to a longitudinal direction thereof, the apparatus comprising;
- a copy start key which generates a copy start signal for starting a copying operation;
- a medium cartridge for storing therein a rolled elongated photosensitive recordign medium;
- a takeup means for taking up the imaging section of the photosensitive recording medium, the photosensitive recording medium being fed from the medium cartridge to the takeup means;
- an exposure means positioned between the medium cartridge and the takeup means for exposing the photosensitive recording medium to light for providing the latent image section;
- reversal sheet feeding means for reversely feeding the photosensitive recording medium so as to position the subsequent non imaging section to upstream of the exposure means; and
- control means for automatically starting a next copying operation in response to manipulation of the copy start key at the reversal sheet feed phase, the control means comprising memory means for storing therein the copy start signal and for automatically starting the next copying operation upon completion of the reversal sheet feeding operation, the copy start signal being generated by the manipulation of the copy start key manipulated at the reversal sheet feeding phase.

2. The image recording apparatus as claimed in claim 1, wherein the medium cartridge has a cartridge shaft, and wherein the reversal sheet feeding means comnprises;
- a rewinding drive power source having a drive shaft;
- a drive gear coupled to the drive shaft;
- a link member having an intermediate portion pivotally supported by the drive shaft, a one end portion and another end portion;
- an idle gear rotatably supported to the one end of the link member and meshedly engageable with the drive gear;
- a rewinding control solenoid coupled to the other end of the link member, the rewinding control solenoid having a first position to provide a first pivot position of the link member, and having a second position to provide a second pivot position of the link member;
- a rod member engageable with the cartridge shaft; and
- a rewinding gear mounted on the rod member, the idle gear being engageable with the rewinding gear at the first position of the idle gear so as to rotate the cartridge shaft in a reversal direction, and disengageable with the rewinding gear at the second position of the idle gear.

3. The image recording apparatus as claimed in claim 2, further comprising cartridge releasable means, the cartridge releasable means comprising;
- the cartridge shaft having a hollow shape;
- the rod member slidably movable relative to the cartridge shaft and engageable therewith; and
- a cartridge releasable solenoid coupled to the rod member for axially moving the rod member so as to selectively disengage the rod member from the hollow cartridge shaft, whereby the cartridge can be disassembled from a frame.

4. The image recording apparatus as claimed in claim 3, further comprising a top plate covering an upper open end of the frame, and wherein the cartridge releasable means further comprises actuation means provided between the top plate and the solenoid for actuating the cartridge releasable solenoid in response to the opening of the top plate.

5. The image recording apparatus as claimed in claim 4, wherein the rewinding control solenoid, the cartridge releasable solenoid and the rewinding drive power source are connected to the control means.

6. An image recording apparatus using an elongated photosensitive recording medium, the elongated photosensitive recording medium being formed with a precedent latent image section and subsequent non imaging section with respect to a longitudinal direction thereof, the apparatus comprising;
- a copy start key which generates a copy start signal for starting a copying operation;
- a medium cartridge for storing therein a rolled elongated photosensitive recording medium;
- a takeup means for taking up the imaging section of the photosensitive recording medium, the photosensitive recording medium being fed from the medium cartridge to the takeup means;
- an exposure means positioned between the medium cartridge and the takeup means for exposing the photosensitive recording medium to light for providing the latent image section;
- reversal sheet feeding means for reversely feeding the photosensitive recorddding medium so as to position the subsequent non imaging section to upstream of the exposure means; and
- control means for automatically starting a next copying operation in response to manipulation of the copy start key at the reversal sheet feed phase, the control means comprising a control unit for forcibly stopping the reversal sheet feeding operation in response to the copy start signal so as to automatically start the copying operation, the copy start signal being generated by the manipulation of the copy start key manipulated at the reversal sheet feeding phase.

7. The image recording apparatus as claimed in claim 6, wherein the medium cartridge has a cartridge shaft, and wherein the reversal sheet feeding means comprises;
- a rewinding drive power source having a drive shaft;
- a drive gear coupled to the drive shaft;
- a link member having an intermediate portion pivotally supported by the drive shaft, a one end portion and another end portion;
- an idle gear rotatably supported to the one end of the link member and meshedly engageable with the drive gear;
- a rewinding control solenoid coupled to the other end of the link member, the rewinding control solenoid having a first position to provide a first pivot position of the link member, and having a second position to provide a second pivot position of the link member;
- a rod member engageable with the cartridge shaft; and a rewinding gear mounted on the rod memeber, the idle gear being engageable with the rewinding gear at the first position of the idle gear so as to rotate the cartridge shaft in a reversal direction, and disengageable with the rewinding gear at the second position of the idle gear.

8. The image recording apparatus as claimed in claim 7, wherein the rewinding control solenoid and the rewinding drive power source are connected to the control means.

* * * * *